(12) United States Patent
Lee

(10) Patent No.: US 11,251,198 B2
(45) Date of Patent: *Feb. 15, 2022

(54) SEMICONDUCTOR DEVICE AND METHOD OF MANUFACTURING THE SAME

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/934,188

(22) Filed: Jul. 21, 2020

(65) Prior Publication Data

US 2020/0350334 A1 Nov. 5, 2020

Related U.S. Application Data

(63) Continuation of application No. 15/181,959, filed on Jun. 14, 2016, now Pat. No. 10,756,103.

(30) Foreign Application Priority Data

Jun. 15, 2015 (KR) .................. 10-2015-0084098
Dec. 21, 2015 (KR) .................. 10-2015-0182863

(51) Int. Cl.
*H01L 27/11582* (2017.01)
*H01L 27/11556* (2017.01)
*H01L 23/528* (2006.01)
*H01L 27/11548* (2017.01)
*H01L 27/11575* (2017.01)

(52) U.S. Cl.
CPC ...... *H01L 27/11582* (2013.01); *H01L 23/528* (2013.01); *H01L 27/11548* (2013.01); *H01L 27/11556* (2013.01); *H01L 27/11575* (2013.01)

(58) Field of Classification Search
CPC ................. H01L 27/11556; H01L 27/11582
See application file for complete search history.

(56) References Cited

U.S. PATENT DOCUMENTS

| | | | |
|---|---|---|---|
| 9,524,903 B2 * | 12/2016 | Lee | .................. H01L 27/11575 |
| 2011/0204420 A1 | 8/2011 | Kim et al. | |
| 2011/0316072 A1 | 12/2011 | Lee | |
| 2016/0268304 A1 * | 9/2016 | Ikeda | ................ H01L 27/11573 |

FOREIGN PATENT DOCUMENTS

| | | |
|---|---|---|
| CN | 102646678 A | 8/2012 |
| CN | 103681684 A | 3/2014 |
| CN | 102237314 B | 7/2014 |

OTHER PUBLICATIONS

Patent Gazette of Chinese Patent No. 106252355 issued on Mar. 9, 2021.

* cited by examiner

*Primary Examiner* — Yu-Hsi D Sun
(74) *Attorney, Agent, or Firm* — IP & T Group LLP

(57) ABSTRACT

There are provided a semiconductor device and a method of manufacturing the same. A semiconductor device includes a memory block having local lines; a peripheral circuit disposed below the memory block; and a plurality of connection lines connecting the peripheral circuit and the local lines to each other, wherein the plurality of connection lines is stacked in a step shape.

11 Claims, 12 Drawing Sheets

SEMICONDUCTOR DEVICE AND METHOD OF MANUFACTURING THE SAME

CROSS-REFERENCE TO RELATED APPLICATION

This application is a continuation of U.S. patent application Ser. No. 15/181,959 filed on Jun. 14, 2016, which claims benefits of priority of Korean Patent Application No. 10-2015-0084098 filed on Jun. 15, 2015, and 10-2015-0182863 filed on Dec. 21, 2015. The disclosure of each of the foregoing application is incorporated herein by reference in its entirety.

BACKGROUND

1. Field

An aspect of the present disclosure relates to a semiconductor device and a method of manufacturing the same, and more particularly, to a three-dimensional semiconductor device including stacked lines and a method of manufacturing the same.

2. Description of the Related Art

A semiconductor includes a memory cell array for storing data, a peripheral circuit for performing program, read, and erase operations of the memory cell array, and a control circuit for controlling the peripheral circuit in response to a command. The memory cell array includes a plurality of memory blocks, and each of the memory blocks includes a plurality of cell strings.

In a three-dimensional semiconductor device, cell strings are arranged in a vertical direction with respect to a substrate, and hence source select lines, word lines, and drain select lines are also stacked in the vertical direction. Particularly, since the number of memory cells and the number of word lines connected to the memory cells increase as the data storage capacity increases, the number of lines for connecting a peripheral circuit to the source select lines, word lines, and drain select lines also increases.

If the number of lines increases, the area occupied by the lines also increases in the three-dimensional semiconductor device. Hence, there is a limitation in decreasing the size of the semiconductor device.

SUMMARY

Embodiments provide a semiconductor device in which stacked lines are formed, thereby decreasing the size of the semiconductor device, and a method of manufacturing the semiconductor device.

According to an aspect of the present disclosure, there is provided a semiconductor device including: a memory block having local lines; a peripheral circuit disposed below the memory block; and a plurality of connection lines connecting the peripheral circuit and the local lines to each other, wherein the plurality of connection lines is stacked in a step shape.

According to an aspect of the present disclosure, there is provided a semiconductor device including: a single memory block having local lines; a peripheral circuit disposed below the memory block; and a plurality of connection lines connecting the peripheral circuit and the local lines to each other, wherein the connection lines are stacked in a step shape of which length is shortened as it comes closer to its upper portion from its lower portion.

According to an aspect of the present disclosure, there is provided a method of manufacturing a semiconductor device, the method including: forming a stack structure under a memory block by alternately stacking insulating layers and conductive layers, wherein the conductive layers includes a lower conductive layer and an upper conductive layer, wherein the lower conductive layer and the upper conductive layer are arranged in a vertical direction; performing a first etching process by patterning the conductive layers and the insulating layers in a step shape so that an upper edge of the lower conductive layer is exposed by the upper conductive layer, wherein the stack structure is reduced to a stepped stack structure by the first etching process; and performing a second etching process by dividing the stepped stack structure into first and second line groups, wherein the first and the second line groups are spaced apart from each other and arranged side by side in a horizontal direction.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art.

Figure 1:
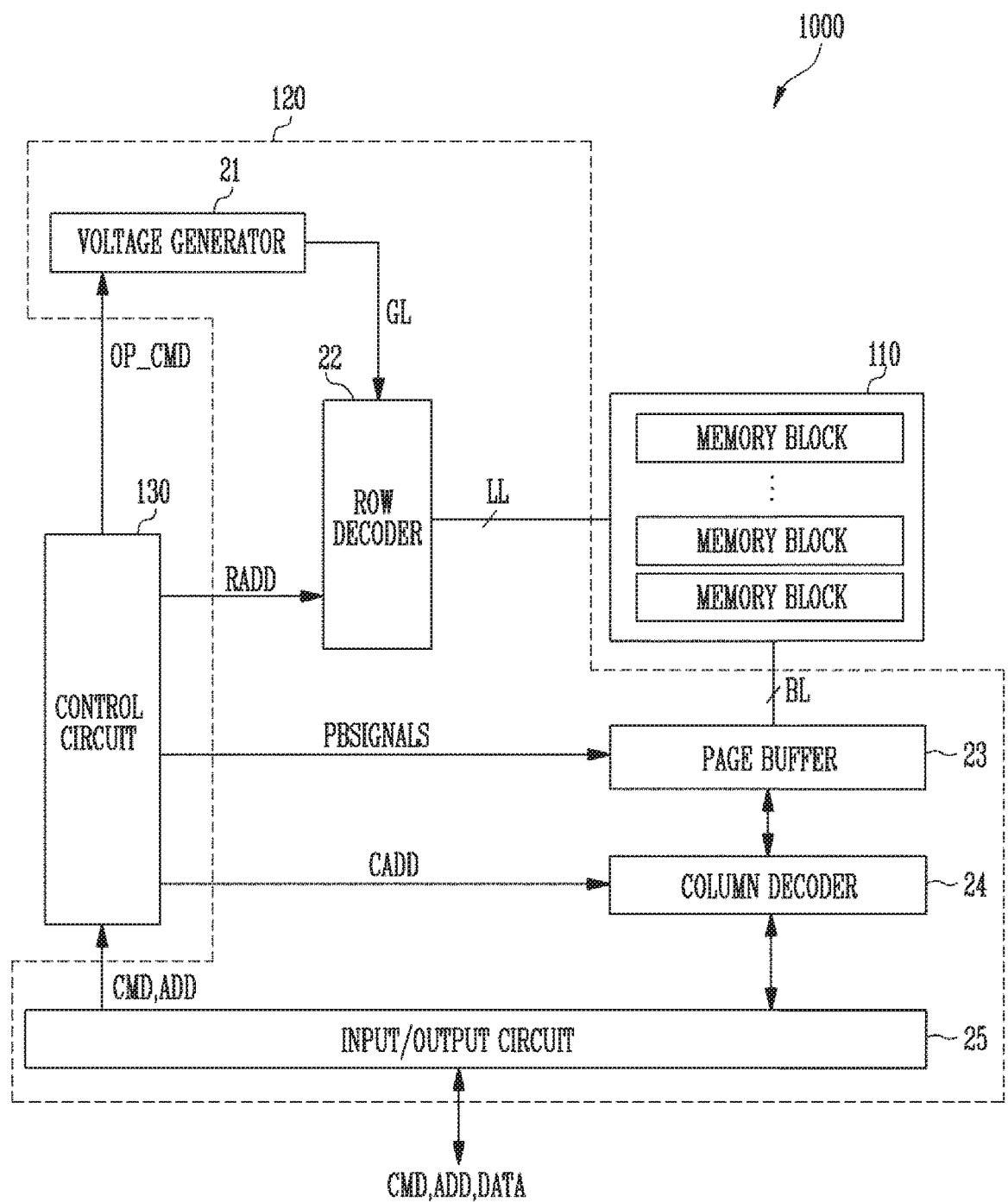
FIG. 1 is a diagram illustrating a semiconductor device according to an embodiment of the present disclosure.

FIG. 1 is a diagram illustrating a semiconductor device according to an embodiment of the present disclosure. Referring to FIG. 1, the semiconductor device 1000 includes a memory cell array in which data is stored, a peripheral circuit 120 configured to perform a program, read, or erase operation of the memory cell array 110, and a control circuit 130 configured to control the peripheral circuit 120.

The memory cell array 110 includes a plurality of memory blocks configured substantially identically to each other. Each of the plurality of memory blocks may include a plurality of cell strings formed into a three-dimensional structure. The plurality of cell strings includes a plurality of memory cells in which data is stored. The plurality of cell strings may be formed into the three-dimensional structure and are vertically arranged from a substrate.

Each of the plurality of memory cells may be configured as a single level cell (SLC) which stores 1 bit of data, or may be configured as a multi level cell (MLC), a triple level cell (TLC), or a quadruple level cell (QLC), which stores two or more bits of data. For example, the MLC is a memory cell in which 2 bits of data are stored, the TLC is a memory cell in which 3 bits of data are stored, and the QLC is a memory cell in which 4 bits of data are stored.

The peripheral circuit 120 includes a voltage generator 21, a row decoder 22, a page buffer 23, a column decoder 24, and an input/output circuit 25. The voltage generator 21 generates operation voltages having various levels in response to an operation signal OP_CMD, and applies the generated operation voltages to global lines GL. For example, the voltage generator 21 may generate a program voltage, a read voltage, and an erase voltage. In addition, the voltage generator 21 may generate various voltages required in various operations.

The row decoder 22 selects one of the memory blocks included in the memory cell array in response to a row address RADD, and transmits operation voltages to local lines LL connected to the selected memory block. For example, the local lines LL may include source select lines, word lines, and drain select lines.

The page buffer 23 is connected to the memory blocks through bit lines BL. The page buffer 23 in program, read, and erase operations transmits/receives data to/from the selected memory block in response to page buffer control signals PBSIGNALS, and stores the transmitted/received data.

The column decoder 24 transmits data between the page buffer 23 and the input/output circuit 25 in response to a column address CADD.

The Input/output circuit 25 transmits to the control circuit 130, a command CMD and an address ADD, provided from the outside; transmits data DATA provided from the outside to the column decoder 24; and outputs, to the outside, the data DATA transmitted from the column decoder 24.

The control circuit 130 controls the peripheral circuit in response to the command CMD and the address ADD. For example, the control circuit 130 may control the peripheral circuit to perform the program, read, or erase operation in response to the command CMD.

Figure 2:
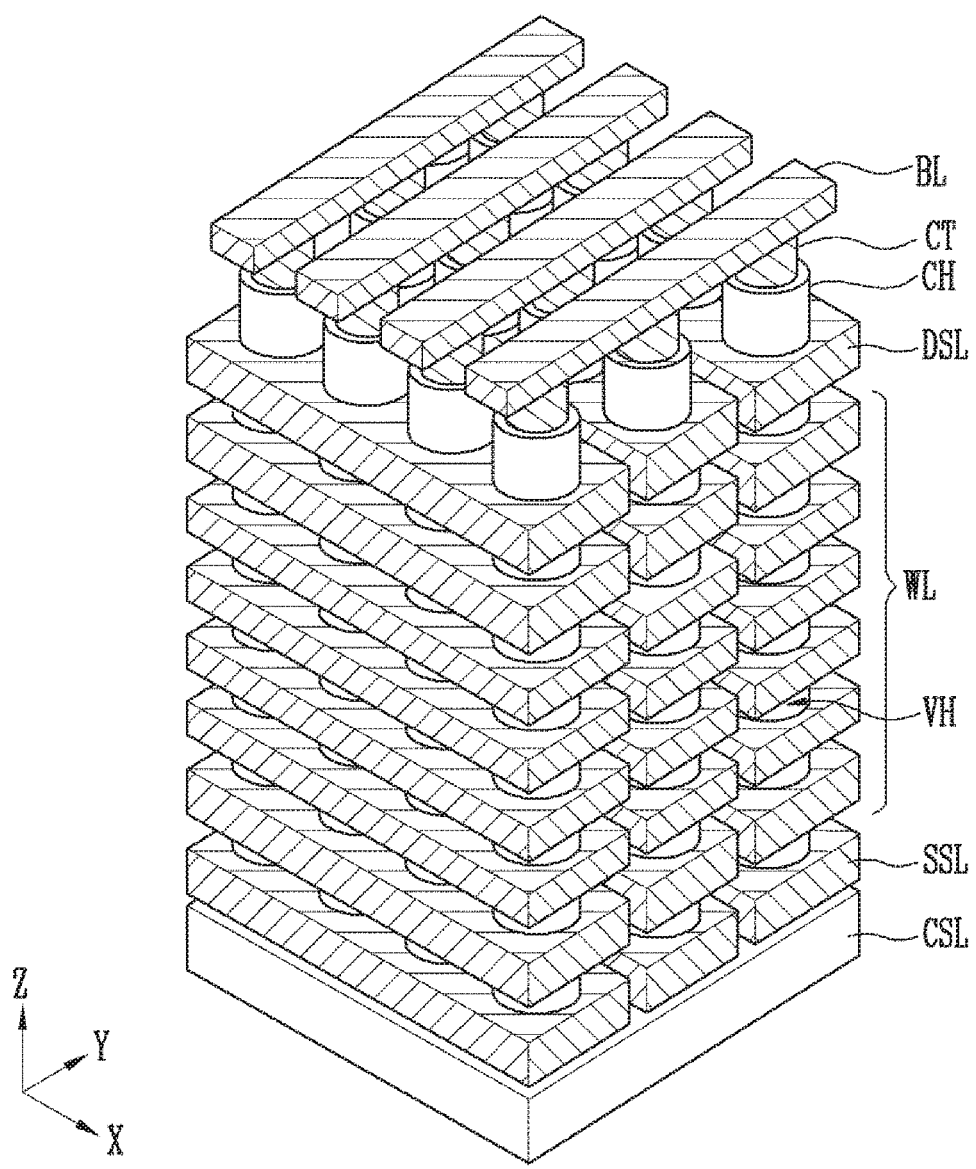
FIG. 2 is a perspective view illustrating a memory block having a three-dimensional structure according to an embodiment of the present disclosure.

FIG. 2 is a perspective view illustrating a memory block having a three-dimensional structure according to an embodiment of the present disclosure. Referring to FIG. 2, the memory block having the three-dimensional structure may include cell strings which are vertically arranged in an I-shape with respect to a substrate.

The cell strings may be vertically arranged between bit lines BL and a common source line CSL. This structure is also referred to as a bit cost scalable (BiCS) structure. For example, when the common source line CSL is horizontally formed over the substrate, the cell strings having the BiCS structure may extend in a vertical direction from the common source line CSL.

More specifically, the cell strings may be arranged in a matrix form in X and Y directions. The cell strings may include source select transistors, memory cells, and drain select transistors, which are formed along vertical channel layers CH. The vertical channel layers CH are vertically arranged over the common source line CSL. The source select transistors are connected to source select lines SSL, the memory cells are connected to word lines WL, and the drain select transistors are connected to drain select lines DSL.

The source select lines SSL, the word lines WL, and the drain select lines DSL are sequentially stacked over the common source line CSL while being spaced apart from each other. The source select lines SSL, the word lines WL, and the drain select lines DSL extend along the X direction, and are spaced apart from each other in the Y direction. The X and Y directions are horizontal with respect to the substrate, and are perpendicular to each other. The vertical channel layers CH are formed inside vertical holes VH. The vertical holes VH vertically penetrate the source select lines SSL, the word lines WL, and the drain select lines DSL. Portions of the vertical channel layers CH may protrude upward from the drain select lines DSL. The bit lines BL may be formed over the vertical channel layers CH protruding upward from the drain select lines DSL. The bit lines BL may be formed in a direction perpendicular to the word lines WL. For example, the bit lines BL extend along the Y direction, and are spaced apart from each other in the X direction. Contact plugs CT may be further formed between the vertical channel layers CH and the bit lines BL.

Figure 3:
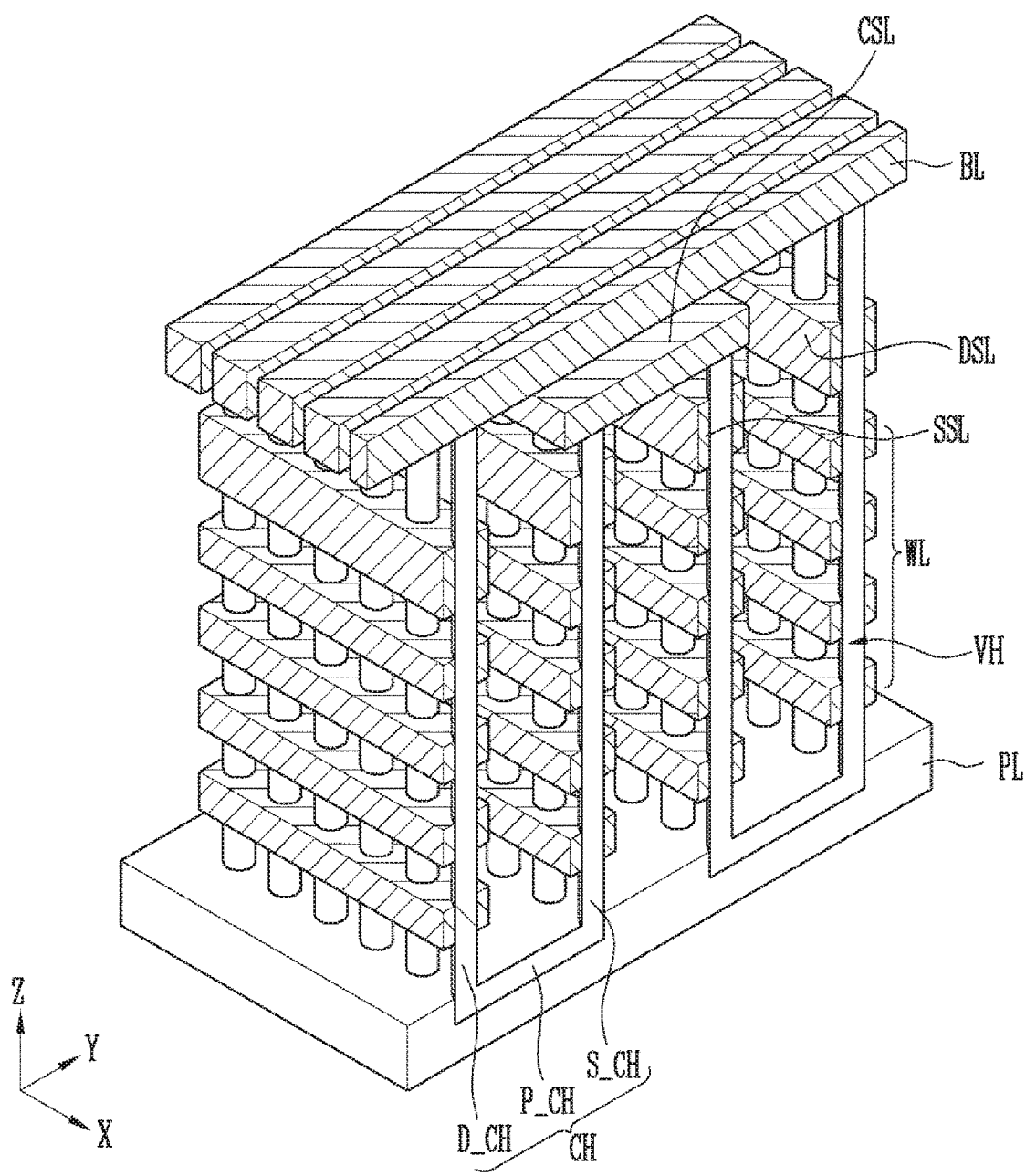
FIG. 3 is a perspective view illustrating a memory block having a three-dimensional structure according to another embodiment of the present disclosure.

FIG. 3 is a perspective view illustrating a memory block having a three-dimensional structure according to another embodiment of the present disclosure. Referring to FIG. 3, cell strings included in the memory block having the three-dimensional structure may be formed in a U-shape.

The cell strings may include first sub-strings vertically arranged between bit lines BL and a pipe line PL, second sub-strings vertically arranged between a common source line CSL and the pipe line PL, and the pipe line PL connecting the first sub-strings and the second sub-strings to each other. This structure is also referred to as a pipe-shaped bit cost scalable (P-BiCS) structure.

For example, when the pipe line PL is horizontally formed over a substrate, the cell strings having the P-BiCS structure may include (i) first sub-strings formed in a vertical direction over the pipe line PL, the first sub-strings being positioned between the bit lines BL and the pipe line PL, and (Ii) second sub-strings formed in the vertical direction over the pipe line PL, the second sub-strings being positioned between the common source line CSL and the pipe line PL. More specifically, the first sub-strings may includes word lines WL and drain select lines DSL, which are stacked while being spaced apart from each other, and first vertical channel layers D_CH vertically penetrating the word lines WL and the drain select lines DSL. The second sub-strings may include word lines WL and source select lines SSL, which are stacked while being spaced apart from each other, and second vertical channel layers S_CH vertically penetrating the word lines WL and the source select lines SSL.

The word lines WL, the source select lines SSL, and the drain select lines DSL may extend along an X direction and be spaced apart from each other in a Y direction. The first vertical channel layers D_CH and the second vertical channel layers S_CH may be formed inside vertical holes VH vertically which are penetrating the word lines WL, the source select lines SSL, and the drain select lines DSL.

The first vertical channel layers D_CH and the second vertical channel layers S_CH are connected to each other by pipe channel layers P_CH in the pipe line PL. The bit lines BL are contacted with the tops of the first vertical channel layers D_CH protruding upward from the drain select lines DSL, and may be arranged to extend along the Y direction and are spaced apart from each other in the X direction.

Figure 4:
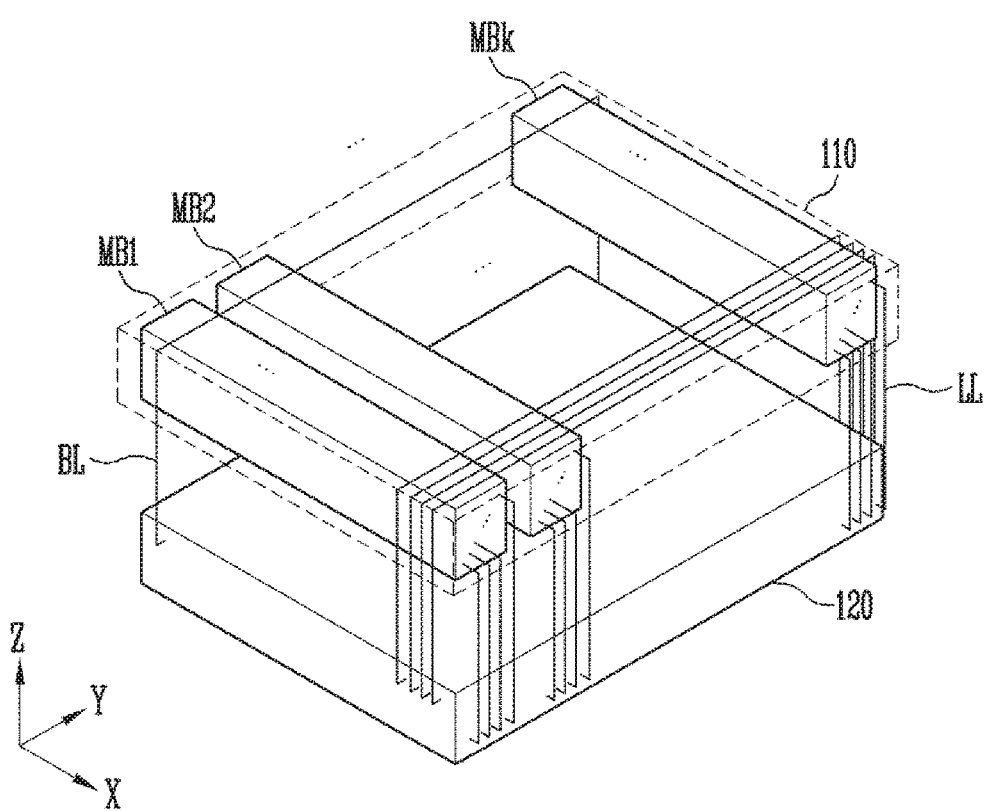
FIG. 4 is a schematic view illustrating a layout of a memory cell array and a peripheral circuit, shown in FIG. 1.

FIG. 4 is a schematic view illustrating a layout of the memory cell array and the peripheral circuit, shown in FIG. 1. Referring to FIG. 4, in order to reduce the size of the semiconductor device, a portion of the peripheral circuit 120 may be formed below the memory cell array 110. For example, portions of the row decoder (22 of FIG. 1) and the page buffer (23 of FIG. 1) in the peripheral circuit 120 may be formed below the memory cell array 110.

The memory cell array 110 includes a plurality of memory blocks MB1 to MBk (k is a positive integer). Local lines LL are connected to each of the memory blocks MB1 to MBk, and bit lines BL are commonly connected to the memory blocks MB1 to MBk. In the case of a three-dimensional semiconductor device, a plurality of word lines is stacked, and hence a large number of local lines LL are connected to the memory blocks MB1 to MBk.

$$N = A \times k \qquad \text{Equation 1:}$$

In 'Equation 1', the total number of source select lines, word lines, and drain select lines, which are connected to one memory block, is 'A,' the number of memory blocks MB1 to MBk is 'k,' and the total number of local lines LL is 'N.' The total number N of local lines LL can be calculated using 'Equation 1.'

For example, when the number of source select lines connected to the one memory block is 3, the number of word lines connected to the one memory block is 32, the number of drain select lines connected to the one memory block is 3, and the number of memory blocks is 10, 'A' is 3+32+3=38, and 'k' is 10. Therefore, the total number N of local lines LL may be 38×10=380 by 'Equation 1.'

As described above, a large number of lines are included in the semiconductor device. If the area occupied by the lines increases, the size of the semiconductor device also increases. Hence, the lines are formed into a stacked structure so that the area occupied by the lines can be reduced.

Figure 5:
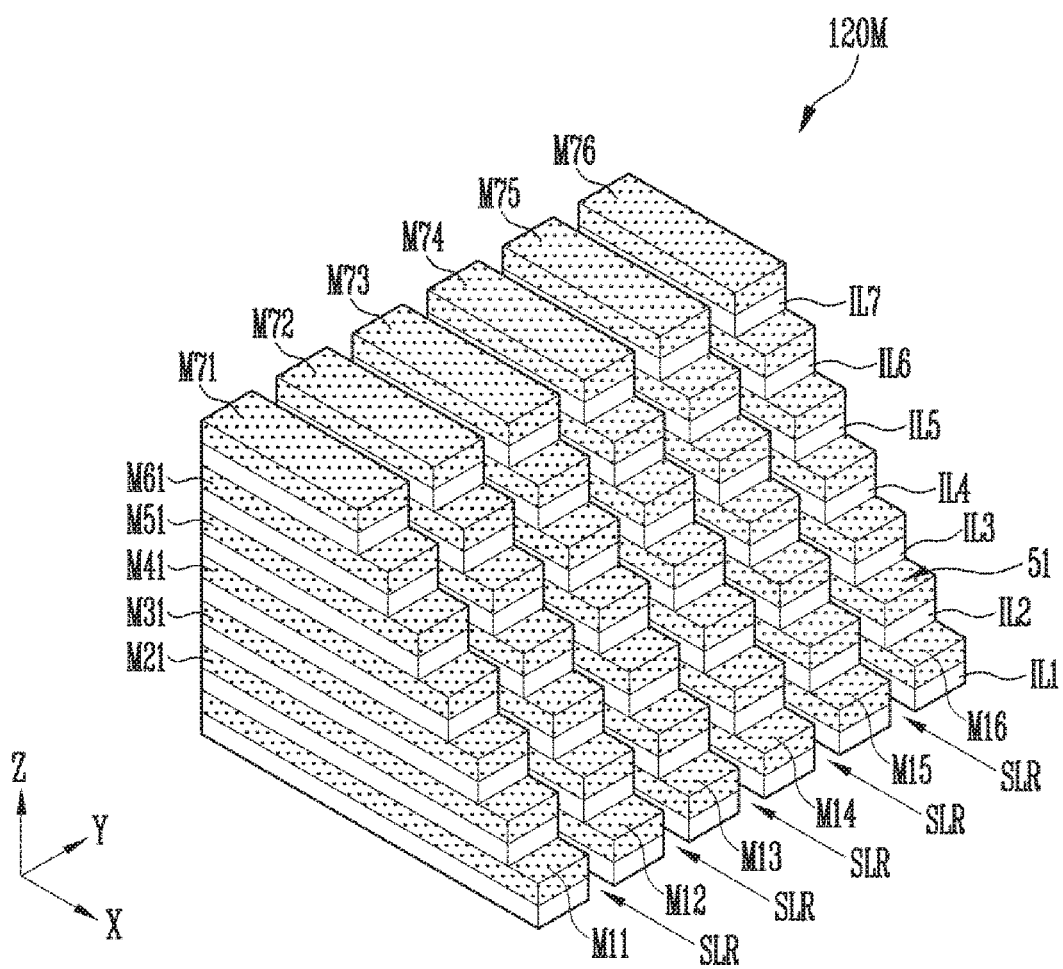
FIG. 5 is a perspective view illustrating a structure of stacked lines according to an embodiment of the present disclosure.

FIG. 5 is a perspective view illustrating a structure of stacked lines according to an embodiment of the present disclosure. Referring to FIG. 5, the stacked lines 120M in the peripheral circuit, with which the local lines (LL of FIG. 4) are directly contacted, include a plurality of lines M11 to M76. The stacked lines 120M may be stacked in a vertical direction, that is, a Z direction, and are further arranged in a Y direction being spaced apart from each other. The structure of the stacked lines 120M will be described in detail as follows.

Among the stacked lines 120M, lines M11 to M16, M21 to M26, M31 to M36, M41 to M46, M51 to M56, M61 to M66, or M71 to M76 are spaced apart from each other in the Y direction and extend in the X direction. A structure in which the lines are stacked in seven layers will be described as an example. In an embodiment, among the layers in which the stacked lines 120M are formed, the lowermost layer is a first layer and the uppermost layer is a seventh layer. First lines M11 to M16 may be formed in the first layer, second lines M21 to M26 may be formed in the second layer, third lines M31 to M36 may be formed in the third layer, fourth lines M41 to 46 may be formed in the fourth layer, fifth lines M51 to M56 may be formed in the fifth layer, sixth lines M61 to M66 may be formed in the sixth layer, and seventh lines M71 to M76 may be formed in the seventh layer.

Regions in which the lines are spaced apart from each other along the Y direction may be referred to as slit regions SLR. In order to electrically isolate the lines M11 to M76 from each other, first to seventh interlayer insulating layers IL1 to IL7 may be formed from the lower ends of the first lines M11 to M16 to the lower ends of the seventh lines M71 to M76, and an insulating layer (not shown) may be formed in each of the slit regions SLR. That is, the insulating layers are formed between the lines arranged horizontally to each other and between the lines stacked in a step shape such that the lines can be electrically spaced apart from each other.

The lengths (X direction) of the first lines M11 to M16 and the first interlayer insulating layers IL1 may be equal to each other, the lengths (X direction) of the second lines M21 to M26 and the second interlayer insulating layers IL2 may be equal to each other, the lengths (X direction) of the third lines M31 to M36 and the third interlayer insulating layers IL3 may be equal to each other, the lengths (X direction) of the fourth lines M41 to M46 and the fourth interlayer insulating layers IL4 may be equal to each other, the lengths (X direction) of the fifth lines M51 to M56 and the fifth interlayer insulating layers IL5 may be equal to each other, the lengths (X direction) of the sixth lines M61 to M66 and the sixth interlayer insulating layers IL6 may be equal to each other, and the lengths (X direction) of the seventh lines M71 to M76 and the seventh interlayer insulating layers IL7 may be equal to each other. Alternatively, the lengths of the lines M1n to M7n and the interlayer insulating layers IL1 to IL7 in each layer may be different from each other depending on semiconductor devices. Differences in length between the lines formed in different layers may be determined by considering widths and length of the local lines LL contacted with the lines.

The first lines M11 to M16 are formed on the first interlayer insulating layers IL1, and the second interlayer insulating layers IL2 are formed on the first lines M11 to M16 such that upper ends of the first lines M11 to M16 are exposed. The second lines M21 to M26 are formed on the second interlayer insulating layers IL2 and the third interlayer insulating layers IL3 are formed on the second lines M21 to M26 such that upper ends of the second lines M21 to M26 are exposed. The third lines M31 to M36 are formed on the third interlayer insulating layers IL3, and the fourth interlayer insulating layers IL4 are formed on the third lines M31 to M36 such that upper ends of the third lines M31 to M36 are exposed. The fourth lines M41 to M46 are formed on the fourth interlayer insulating layers IL4 and the fifth interlayer insulating layers IL5 are formed on the fourth lines M41 to M46 such that upper ends of the fourth lines M41 to M46 are exposed.

The fifth lines M51 to M56 are formed on the fifth interlayer insulating layers IL5 and the sixth interlayer insulating layers IL6 are formed on the fifth lines M51 to M56 such that upper ends of the fifth lines M51 to M56 are exposed. The sixth lines M61 to M66 are formed on the sixth interlayer insulating layers IL6 and the seventh interlayer insulating layers 1L7 are formed on the sixth lines M61 to M66 such that upper ends of the sixth lines M61 to M66 are exposed. The seventh lines M71 to M76 are formed on the seventh interlayer insulating layers IL7. Local lines may be formed on the exposed lines of each layer. More specifically, contact plugs included in the local lines may be formed on the exposed lines of each layer.

As described above, the stacked lines 120M are arranged in the Z and Y directions. The number of lines is as many as the number obtained by multiplying together the number of lines stacked in the Y direction and the number of lines separated in the Y direction. A method of forming the stacked lines 120M will be described in detail as follows.

Figure 6A:
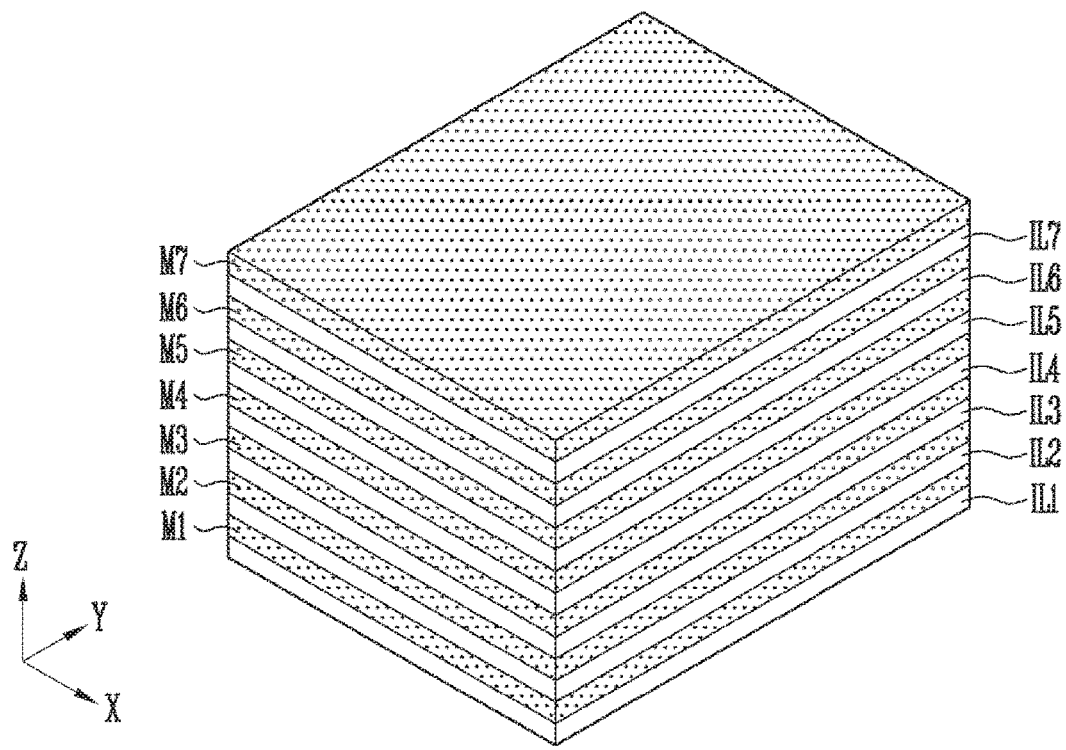
FIGS. 6A to 6C are perspective views illustrating a manufacturing method of stacked lines according to an embodiment of the present disclosure.
Figure 6B:
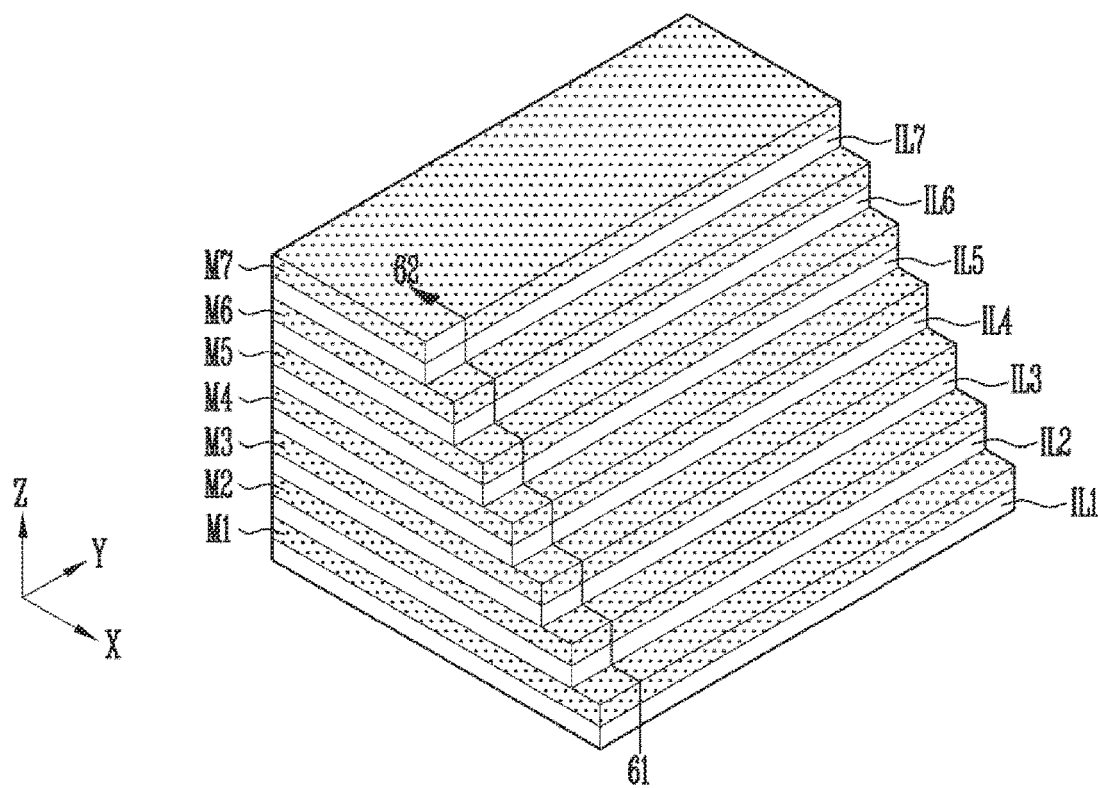
Figure 6C:
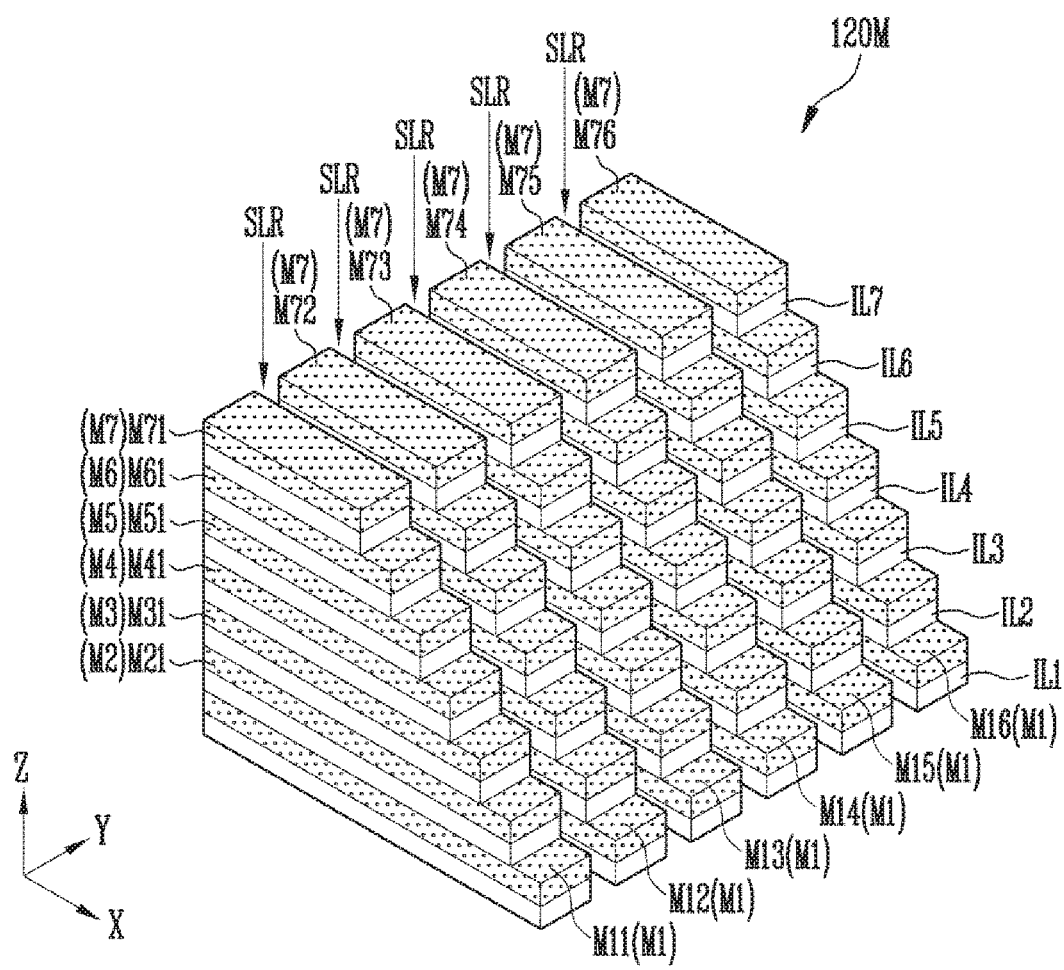

FIGS. 6A to 6C are perspective views illustrating a manufacturing method of the stacked lines according to the embodiment of the present disclosure. Referring to FIG. 6A, a first interlayer insulating layer IL1, a first conductive layer M1, a second interlayer insulating layer IL2, a second conductive layer M2, a third interlayer insulating layer IL3, a third conductive layer M3, a fourth interlayer insulating layer IL4, a fourth conductive layer M4, a fifth interlayer insulating layer IL5, a fifth conductive layer M5, a sixth interlayer insulating layer IL6, a sixth conductive layer M6, a seventh interlayer insulating layer IL7, and a seventh conductive layer M7 are sequentially formed over a substrate (not shown). In this embodiment, seven interlayer insulating layers and seven conductive layers are stacked. However, the number of interlayer insulating layers and the number of conductive layers may be changed depending on semiconductor devices.

The first to seventh interlayer insulating layers IL1 to IL7 may be formed of an oxide layer, and the first to seventh conductive layers M1 to M7 may be formed of a metal layer. For example, the first to seventh conductive layers M1 to M7 may be formed of a tungsten layer. There are various methods of forming the first to seventh conductive layers M1 to M7 using the tungsten layer. For example, a replacement process may be performed, in which nitride layers and tungsten layers are formed between the first to seventh interlayer insulating layers IL1 to IL7, and a thermal treatment process is performed so that the tungsten layers are mixed into the nitride layers. Alternatively, a process may be performed in which sacrificial layers are formed between the first to seventh interlayer insulating layers IL1 to IL7 and then removed in a subsequent process, and tungsten layers are filled in regions from which the sacrificial layers are removed.

In addition, the first to seventh interlayer insulating layers IL1 to IL7 and the first to seventh conductive layers M1 to M7 may be formed by various methods. Hereinafter, the case in which the first to seventh conductive layers M1 to M7 are formed of the tungsten layer will be described as an example. However, the tungsten layer is an illustrative embodiment, and therefore, various types of conductive layers may be used as well as the tungsten layer.

Referring to FIG. 6B, a first etching process is performed such that the first to seventh interlayer insulating layers IL1 to IL7 and the first to seventh conductive layers M1 to M7, which respectively form pairs, have a step structure 61-62 of which length is shortened as it comes closer to its upper portion from its lower portion. The first etching process may be performed as a slimming process. The slimming process is sequentially performed on the seventh to first conductive layers M7 to M1 and the seventh to first interlayer insulating layers IL7 to IL1 to form a step structure in which upper ends of the seventh to first conductive layers M7 to M1 are sequentially exposed.

For example, portions of the seventh conductive layer M7 and the seventh interlayer insulating layer IL7 are removed such that an upper end of the seventh conductive layer M7 is removed. An etching process for partially removing the portions of the seventh conductive layer M7 and the seventh interlayer insulating layer IL7 is performed so that an end of the sixth conductive layer M6 is exposed. If the sixth conductive layer M6 is exposed, portions of the sixth conductive layer M6 and the sixth interlayer insulating layer IL6 are removed such that a partial upper surface of the sixth conductive layer M6 remains. In this manner, the first etching process is repeated until an upper end of the first conductive layer M1 is exposed, thereby forming the step structure.

Referring to FIG. 6C, a second etching process for separating the first to seventh conductive layers M1 to M7 having the step structure by slit regions SLR is performed. The second etching process may be performed using etching mask patterns (not shown) including a plurality of openings. For example, the openings may extend in the X direction, and may be arranged horizontally to each other along the Y direction. The second etching process of patterning the seventh to first conductive layers M7 to M1 and the seventh to first interlayer insulating layers IL7 to IL1, respectively, is performed, so that the first to seventh conductive layers M1 to M7 formed in the same layer, that is, located at the same level, are separated into a plurality of lines.

The first layer in which the first conductive layer M1 is formed will be described as an example. If the second etching process is performed, the first conductive layer M1 is separated into six conductive layers by five slit regions SLR, thereby forming six lines M11 to M16. The width of the six lines M11 to M16 and the distances between six lines M11 to M16 may be variously adjusted depending on widths of the slit regions SLR and distances between the slit regions SLR. To electrically isolate between the lines, an insulating layer may be filled in the slit regions SLR. As described above, each of the first to seventh conductive layers M1 to M7 formed in the first to seventh layers is separated into six conductive layers, thereby forming a plurality of lines M11 to M76. Thus, it is possible to form the stacked lines 120M for connecting different local lines in a limited region.

Figure 7:
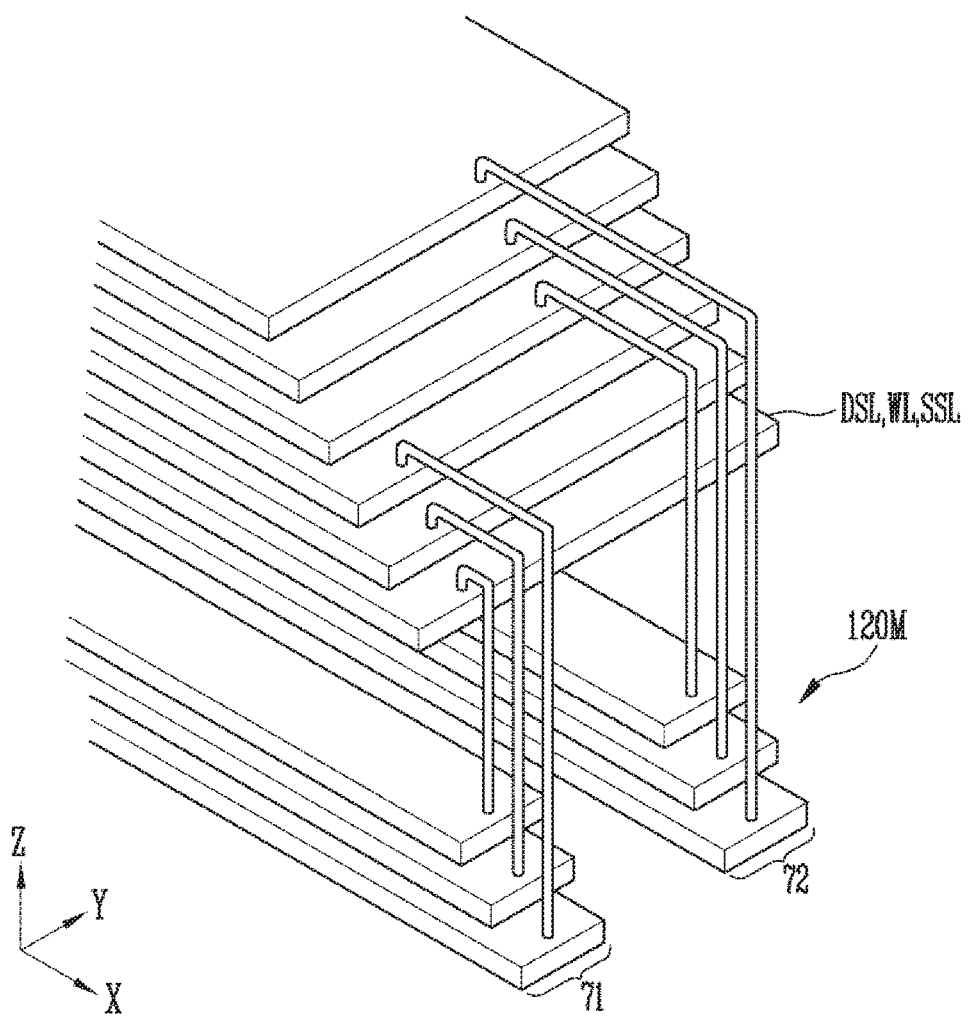
FIG. 7 is a perspective view illustrating an embodiment in which the stacked lines are applied to a three-dimensional semiconductor device.

FIG. 7 is a perspective view illustrating an embodiment in which the stacked lines are applied to a three-dimensional semiconductor device. Referring to FIG. 7, the three-dimensional semiconductor device includes a plurality of local lines LL connecting a memory block and a peripheral circuit to each other. The local lines LL may include a plurality of source select lines SSL, a plurality of word lines WL, a plurality of drain select lines DSL, and a plurality of contact plugs. For example, the source select lines SSL, the word lines WL, and the drain select lines DSL, which are included in the memory block, may be sequentially stacked over a substrate while being spaced apart from each other. The contact plugs may be formed such that the source select lines SSL, the word lines WL, and the drain select lines DSL are connected to the stacked lines 120M.

As the data storage capacity of the semiconductor device increases, the number of memory cells increases, and therefore, the number of word lines WL connected to the memory cells also increases. If the number of word lines WL increases, the number of local lines LL including the word lines WL also increases.

Thus, as shown in a slimming structure of the word lines WL included in the three-dimensional semiconductor device, the lines 120M for connecting the local lines LL to the peripheral circuit (120 of FIG. 4) are stacked in a step structure. The lines 120M stacked in the step structure are further separated into a plurality of lines through slit regions, so that a greater number of lines 120M to which different voltages are to be applied can be formed in a limited region. For example, local lines LL connected to one memory block may be divided into groups, and local lines LL corresponding to each group may be respectively connected to line groups 71 and 72 separated by a slit region.

Figure 8:
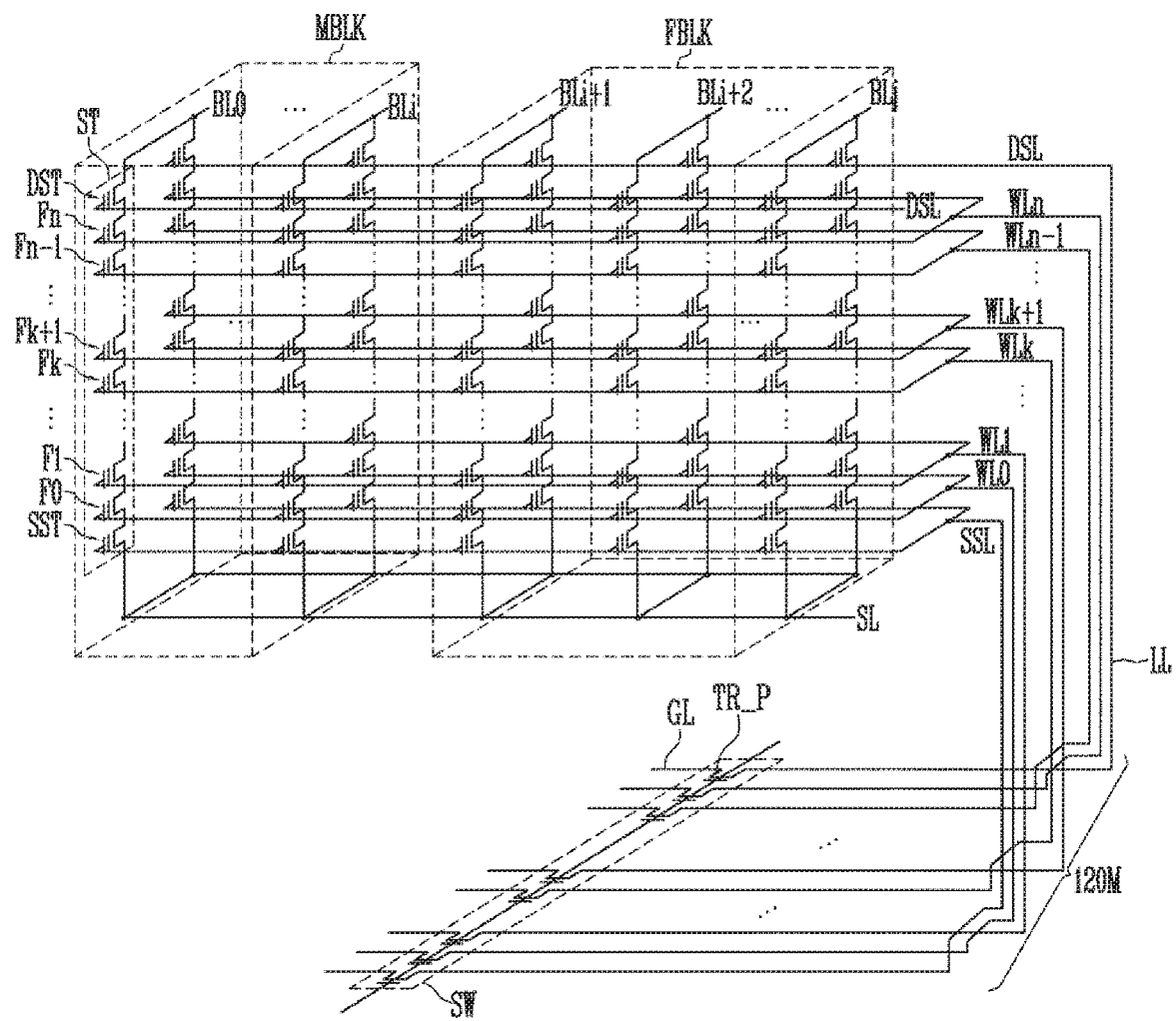
FIG. 8 is a circuit diagram illustrating an embodiment in which the stacked lines are applied to a three-dimensional semiconductor device.

FIG. 8 is a circuit diagram illustrating an embodiment in which the stacked lines are applied to a three-dimensional semiconductor device. Referring to FIG. 8, memory blocks MBLK and FBLK of the three-dimensional semiconductor device may include main blocks MBLK and flag blocks FBLK. Main data used by a user may be stored in the main blocks MBLK, and data required in an operation of the semiconductor device may be stored in the flag blocks FBLK. Each of the memory blocks MBLK and FBLK may include source select transistors SST, memory cells F0 to Fn, and drain select transistors DST, which are connected in a vertical direction from a substrate. The source select transistors SST may be connected to a common source line SL, and the drain select transistors DST may be connected to bit lines BL0 to BLj. Gates of the source select transistors SST may be connected to source select lines SSL, gates of the memory cells F0 to Fn may be connected to word lines WL0 to WLn, and gates of the drain select transistors DST may be connected to drain select lines DSL.

The source select lines SSL, the word lines WL0 to WLn, and the drain select lines DSL may be included in local lines LL. The local lines LL may be connected to a peripheral circuit through lines 120M of the peripheral circuit. For example, the local lines LL may be connected to a pass switch circuit SW included in a row decoder of the peripheral circuit. The pass switch circuit SW may be a circuit that transmits an operation voltage to local lines LL of a selected memory block among a plurality memory blocks. The pass switch circuit SW may include a plurality of pass transistors TR_P connected between global lines GL and the local lines LL. Although not shown in this figure, the global lines GL may be connected to the voltage generator (21 of FIG. 1).

Figure 9:
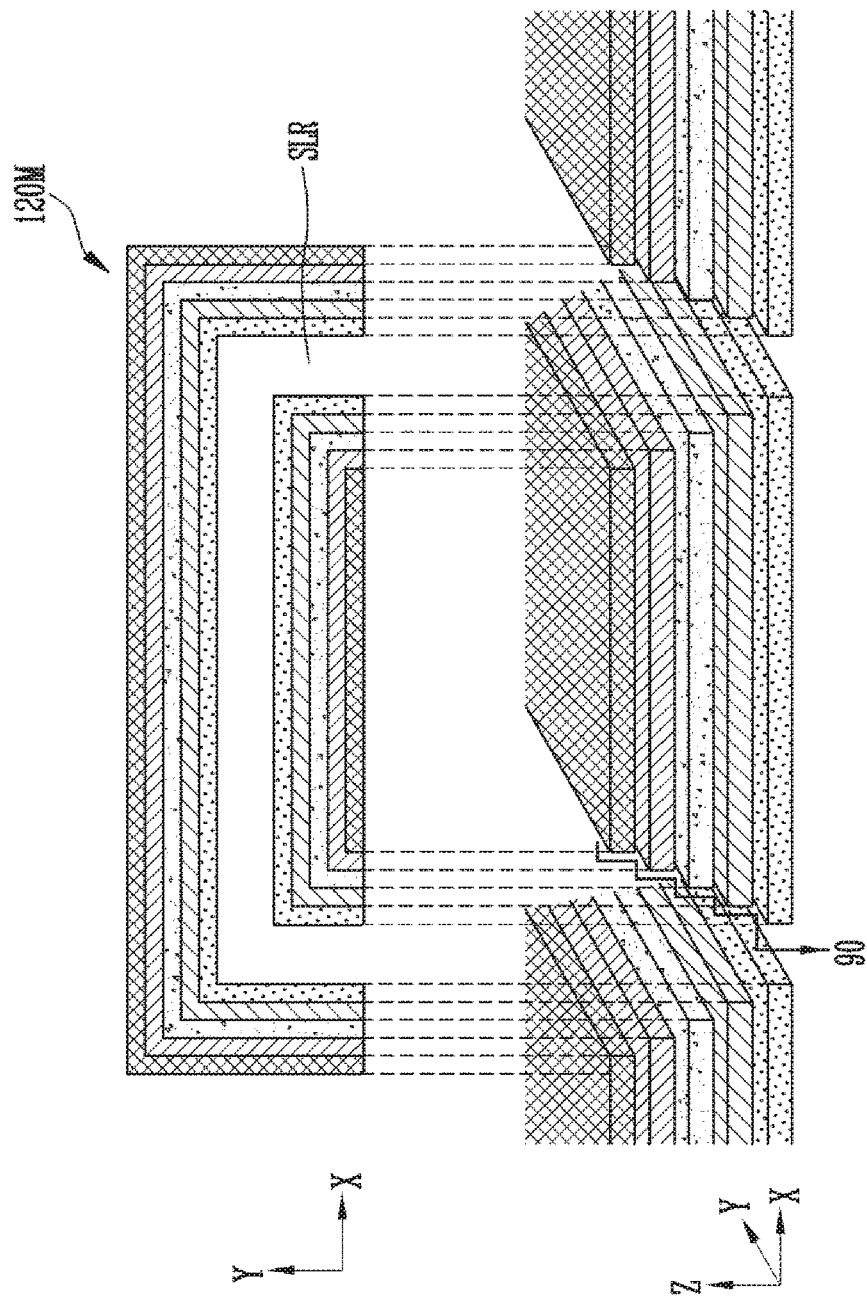
FIG. 9 is a view illustrating a structure of stacked lines according to another embodiment of the present disclosure.

FIG. 9 is a view illustrating a structure of stacked lines according to another embodiment of the present disclosure. Referring to FIG. 9, the upper structure is a layout of the stacked lines 120M. The lower structure is a perspective view of the stacked lines 120M. The upper structure is a X-Y plane view and the lower structure is a perspective view.

The number of stacked lines 120M is determined by the number of layers in a step structure 90 and the number of slit regions SLR. A layout for connecting the stacked lines 120M and a peripheral circuit to each other may be determined by the shape of the slit regions SLR. Thus, when the layout of the slit regions SLR is modified, the stacked lines 120M can be formed into various structures in which a plurality of local lines LL and the peripheral circuit can be connected to each other in a limited region. In addition, the thickness and width of the lines formed in each layer can be adjusted, and thus resistances of the lines for each layer can be differently adjusted. Accordingly, the lines can be formed by considering electrical characteristics. Although not shown in FIG. 9, interlayer insulating layers are formed between the stacked lines 120M, so that the stacked lines 120M located at different levels can be electrically isolated from each other.

As described above, a plurality of lines can be formed in a limited region without increasing the area occupied by the lines, and thus the size of the semiconductor device can be reduced.

Figure 10:
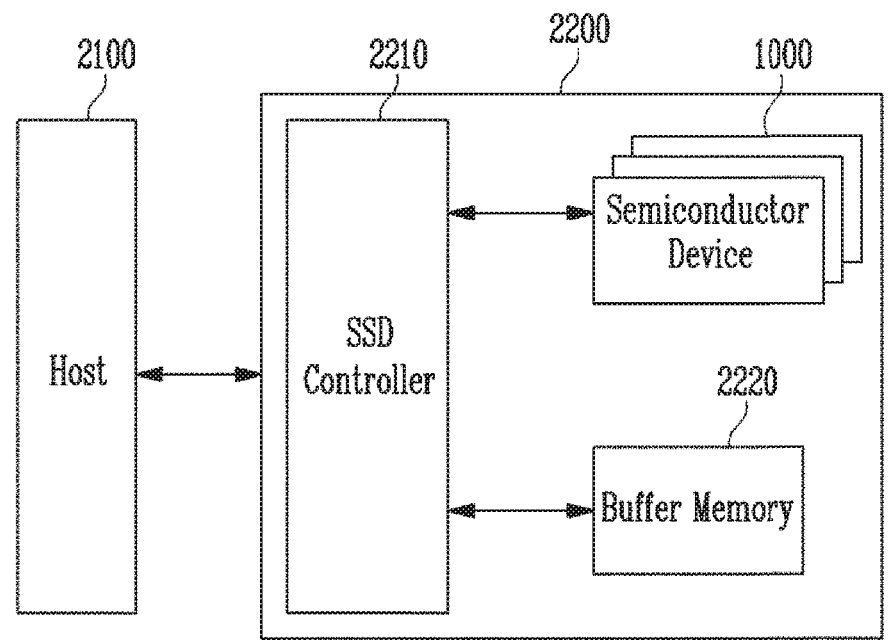
FIG. 10 is a block diagram illustrating a solid state drive (SSD) including a semiconductor device according to an embodiment of the present disclosure.

FIG. 10 is a block diagram illustrating a solid state drive (SSD) including a semiconductor device according to an embodiment of the present disclosure. Referring to FIG. 10, the SSD device 2000 includes a host 2100 and an SDD 2200. The SDD 2200 includes an SSD controller 2210, a buffer memory 2220, and a semiconductor device 1000.

The SSD controller 2210 provides physical interconnection between the host 2100 and the SSD 2200. That is, the SSD controller 2210 serves as an interface of the SSD 2200, corresponding to a bus format of the host 2100. Particularly, the SSD controller 2210 decodes a command provided from the host 2100. The SSD controller 2210 accesses the semiconductor device 1000 based on the decoded result. The bus format of the host 2100 may include a universal serial bus (USB), a small computer system interface (SCSI), a PCI express, an ATA, a parallel ATA (PATA), a serial ATA (SATA), a serial attached SCSI (SAS), and the like.

The buffer memory 2220 temporarily stores program data provided from the host 2100 or data read out from the semiconductor device 1000. When data existing in the semiconductor device 1000 is cached upon a read request of the host 2100, the buffer memory 2220 performs a cache function and provides the cached data directly to the host 2100. Generally, a data transmission speed of a bus format for example, SATA or SAS of the host 2100 may be higher than that of a memory channel of the SSD 2200. That is, when an interface speed of the host 2100 is faster than the transmission speed of the memory channel of the SSD 2200, the buffer memory 2200 with a large storage capacity is provided to control the different speeds. The buffer memory 2220 may include a synchronous DRAM to provide sufficient buffering to the SSD 2200 which is used as a large-capacity auxiliary storage device.

The semiconductor device 1000 may include a storage medium of the SSD 2200. For example, the semiconductor device 1000, as described in FIG. 1, may be a nonvolatile memory device having a large storage capacity. The semiconductor device may be a NAND flash memory among nonvolatile memories.

Figure 11:
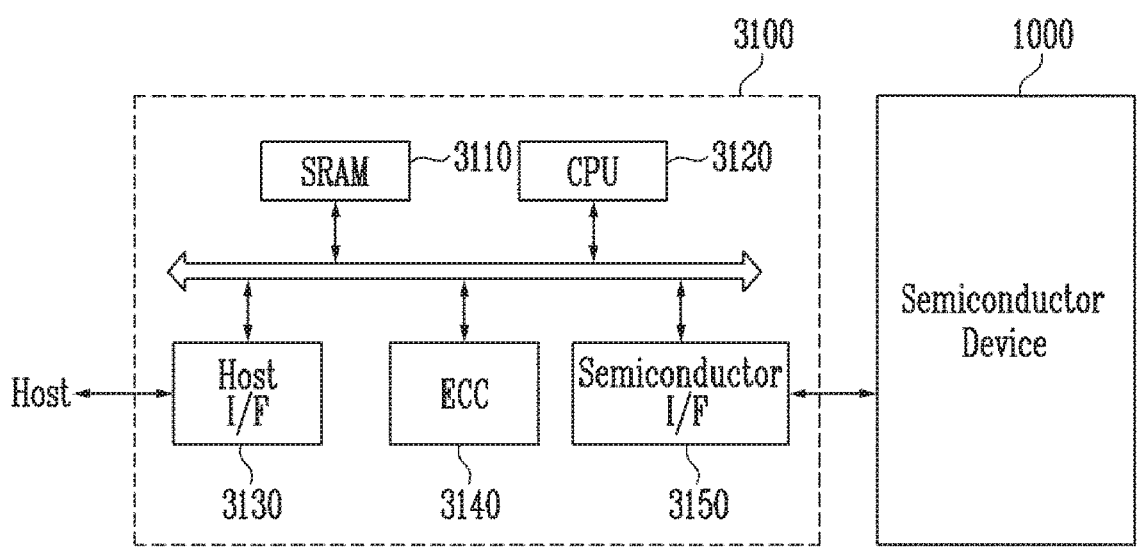
FIG. 11 is a block diagram illustrating a memory system including a semiconductor device according to an embodiment of the present disclosure.

FIG. 11 is a block diagram illustrating a memory system including a semiconductor device according to an embodiment of the present disclosure. Referring to FIG. 11, the memory system 3000 according to the embodiment of the present disclosure may include a memory controller 3100 and a semiconductor device 1000.

The semiconductor memory device 1000 may be configured substantially identical to the semiconductor device of FIG. 1, and therefore, detailed description of the semiconductor device 1000 will be omitted.

The memory controller 3100 may be configured to control the semiconductor device 1000. An SRAM 3110 may be used as a working memory of a CPU 3120. A host interface (host I/F) 3130 may have a data exchange protocol for a host connected to the memory system 3000. An error correction circuit (ECC) 3140 provided in the memory controller 3100 may detect and correct errors included in data read out from the semiconductor device 1000. A semiconductor interface (semiconductor I/F) 3150 may interface elements of the semiconductor device 1100. The CPU 3120 may perform a control operation for data exchange of the memory controller 3100. Although not shown in FIG. 11, the memory system 300 may further include a ROM (not shown) for storing code data for interfacing the host.

The memory system 3000 may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, one of various electronic devices that constitute a home network, etc.

Figure 12:
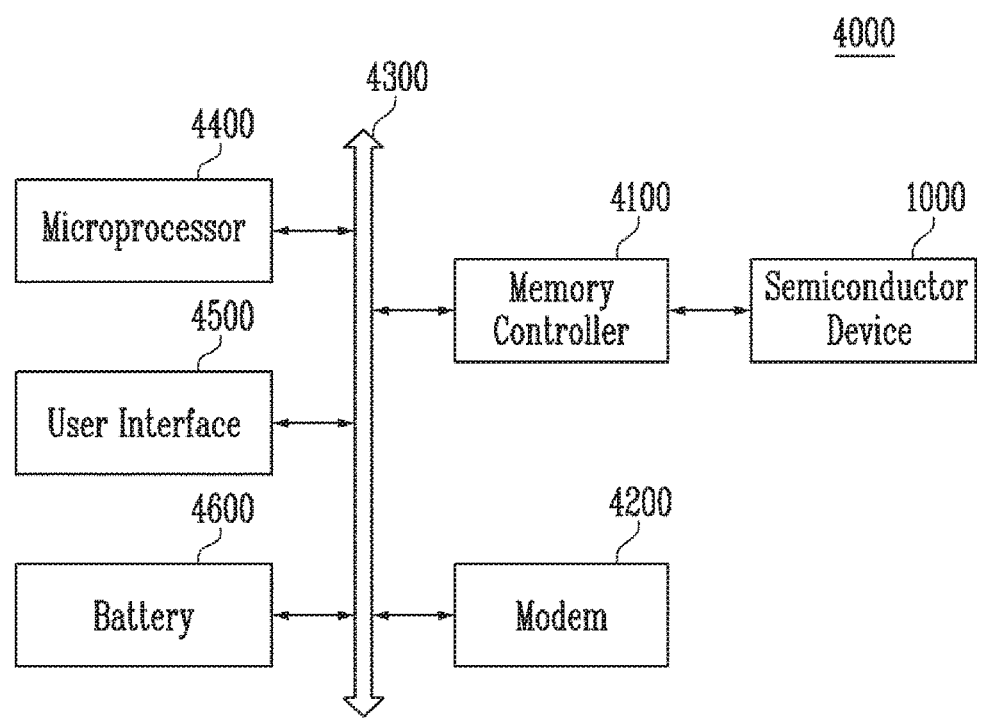
FIG. 12 is a diagram illustrating a schematic configuration of a computing system including a semiconductor device according to an embodiment of the present disclosure.

FIG. 12 is a diagram illustrating a schematic configuration of a computing system including a semiconductor device according to an embodiment of the present disclosure. Referring to FIG. 12, the computing system 4000 includes a semiconductor device 1000, a memory controller 4100, a modem 4200, a microprocessor 4400, and a user interface 4500, which are electrically connected to a bus 4300.

When the computing system 4000 is a mobile device, a battery 4600 for supplying operation voltages of the computing system 4000 may be additionally provided in the computing system 4000. Although not shown in FIG. 12, the computing system 4000 may further include an application chip set, such as a camera image processor (CIS), a mobile DRAM, and the like.

The semiconductor device 1000 may be configured substantially identical to the semiconductor device of FIG. 1, and therefore, detailed description of the semiconductor device 1000 will be omitted. The memory controller 4100 and the semiconductor device 1000 may constitute an SSD.

The semiconductor device and the memory controller may be packaged in various forms. For example, the semiconductor device and the memory controller may be packaged into a package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to the present disclosure, a plurality of lines are formed in a stacked structure so that the area occupied by the lines can be decreased, thereby decreasing the size of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
   a peripheral circuit;
   connection lines stacked on the peripheral circuit in a first direction, wherein the connection lines are electrically coupled to the peripheral circuit and stacked in a step shape;
   a memory cell array stacked on the connection lines in a first direction, wherein the memory cell array includes memory cells which are stacked in the first direction and word lines electrically coupled to the memory cells; and
   local lines extending in the first direction and electrically coupling the connection lines and the word lines, respectively.

2. The semiconductor device of claim 1, wherein the connection lines are interposed between the peripheral circuit and the memory cell array.

3. The semiconductor device of claim 1, wherein the connection lines extend in a second direction crossing the first direction, a connection line adjacent to the memory cell array has a first length along the second direction, a connection line adjacent to the peripheral circuit has a second length along the second direction, and the second length is greater than the first length.

4. A semiconductor device comprising:
   a peripheral circuit;
   a first line group stacked on the peripheral circuit and electrically coupled to the peripheral circuit, wherein the first line group includes first connection lines stacked in a step shape;
   a second line group stacked on the peripheral circuit and electrically coupled to the peripheral circuit, wherein the second line group includes second connection lines stacked in a step shape;
   a first memory block stacked on the first line group, wherein the first memory block includes first memory cells stacked on top of each other and first word lines electrically coupled to the first memory cells;
   a second memory block stacked on the second line group, wherein the second memory block includes second memory cells stacked on top of each other and second word lines electrically coupled to the second memory cells;
   first local lines electrically coupling the first connection lines and the first word lines, respectively; and
   second local lines electrically coupling the second connection lines and the second word lines, respectively.

5. The semiconductor device of claim 4, wherein the first line group includes the first connection lines and first insulating layers alternately stacked on each other.

6. The semiconductor device of claim 4, wherein the first line group is interposed between the peripheral circuit and the first memory block.

7. The semiconductor device of claim 4, wherein the first line group and the second line group are located at substantially the same level.

8. A semiconductor device comprising:
   a peripheral circuit;
   a first line group stacked on the peripheral circuit and electrically coupled to the peripheral circuit, wherein first line group includes first connection lines stacked in a step shape;
   a second line group stacked on the peripheral circuit and electrically coupled to the peripheral circuit, wherein the second line group includes second connection lines stacked in a step shape;

a memory cell array stacked on the first line group and the second line group, wherein the memory cell array includes first memory cells, second memory cells stacked on the first memory cells, first word lines electrically coupled to the first memory cells, and second word lines stacked on the first word lines and electrically coupled to the second memory cells;

first local lines electrically coupling the first connection lines and the first word lines, respectively; and second local lines electrically coupling the second connection lines and the second word lines, respectively.

9. The semiconductor device of claim 8, wherein the first line group includes the first connection lines and first insulating layers alternately stacked on each other.

10. The semiconductor device of claim 8, wherein the first line group and the second line group are interposed between the peripheral circuit and the memory cell array.

11. The semiconductor device of claim 8, wherein the first line group and the second line group are located at substantially the same level.

* * * * *